United States Patent
Mollenkopf et al.

(10) Patent No.: US 6,377,786 B2
(45) Date of Patent: Apr. 23, 2002

(54) SYSTEM AND METHOD FOR GAIN CONTROL OF INDIVIDUAL NARROWBAND CHANNELS USING A WIDEBAND POWER MEASUREMENT

(75) Inventors: Steven Mollenkopf, San Diego; James H. Thompson, Carlsbad, both of CA (US)

(73) Assignee: Qualcomm, Inc., San Diego, CA (US)

( * ) Notice: Subject to any disclaimer, the term of this patent is extended or adjusted under 35 U.S.C. 154(b) by 0 days.

(21) Appl. No.: 09/829,569

(22) Filed: Apr. 9, 2001

Related U.S. Application Data

(63) Continuation of application No. 09/150,545, filed on Sep. 9, 1998, now Pat. No. 6,252,915.

(51) Int. Cl.[7] .......................... H01Q 11/12; H04B 1/04
(52) U.S. Cl. ........................ 455/127; 455/126; 455/13.4; 455/13.1; 455/522; 455/69; 375/297; 330/151; 330/279
(58) Field of Search ................. 455/12.1, 13.1, 455/69, 13.4, 427, 127, 123, 126, 115, 522; 375/345, 296, 297; 330/149, 51, 151

(56) References Cited

U.S. PATENT DOCUMENTS

| | | | |
|---|---|---|---|
| 5,103,459 A | | 4/1992 | Gilhousen et al. |
| 5,159,283 A | * | 10/1992 | Jensen .......................... 330/129 |
| 5,216,692 A | | 6/1993 | Ling .............................. 375/1 |
| 5,247,542 A | * | 9/1993 | Onodera et al. .............. 375/60 |
| 5,548,616 A | * | 8/1996 | Mucke et al. ................ 375/295 |
| 5,563,892 A | * | 10/1996 | Kostreski et al. ............ 370/112 |
| 5,715,526 A | * | 2/1998 | Weaver, Jr. et al. ......... 455/126 |
| 5,880,631 A | * | 3/1999 | Sahota .......................... 330/51 |
| 5,937,011 A | * | 8/1999 | Carney et al. ............... 375/297 |
| 5,974,093 A | * | 10/1999 | Lee .............................. 375/297 |
| 6,070,086 A | * | 5/2000 | Dobrica ....................... 455/222 |

FOREIGN PATENT DOCUMENTS

| | | |
|---|---|---|
| EP | 0805568 | 4/1997 |
| JP | 02126733 | 5/1990 |
| JP | 08298484 | 11/1996 |
| WO | 9737438 | 10/1997 |

* cited by examiner

Primary Examiner—William Trost
Assistant Examiner—Marceau Milord
(74) Attorney, Agent, or Firm—Philip R. Wadsworth; Gregory D. Ogrod; Thomas M. Thibault

(57) ABSTRACT

The present invention comprises a system and method for gain control of individual narrowband channels using a wideband power measurement. The present invention comprises a transmit power tracking loop which controls the power of the transmitted signal by controlling the gain applied to the signal. The function of the transmit power tracking loop is to measure power, accept commands for power adjustment, and adjust the power. Gain control is performed by producing an error signal using the comparison of measurements of a total of estimated powers of each narrowband signal and a measurement of the modulated wideband signal. In addition, open loop control is performed by accepting open loop commands generated by an algorithm.

4 Claims, 6 Drawing Sheets

SYSTEM AND METHOD FOR GAIN CONTROL OF INDIVIDUAL NARROWBAND CHANNELS USING A WIDEBAND POWER MEASUREMENT

This application is a continuation of U.S. patent application Ser. No. 09/150,545, filed Sep. 9, 1998, now U.S. Pat. No. 6,252,915. This patent application is incorporated herein by reference in its entirety.

BACKGROUND OF THE INVENTION

1. Field of the Invention

The present invention relates generally to mobile telephone systems, and more particularly to a gain control method and system for mobile telephone systems. The present invention is most applicable to gateways using code division multiple access (CDMA) modulation techniques where power conservation is critical.

2. Description of Background Art

Mobile telephone systems allow customers to place telephone calls from wireless devices referred to as mobile telephones or subscriber units. The mobile telephone transmits the signal to a gateway. The gateway is interconnected to a mobile telephone switch. The mobile telephone switch interconnects the gateways to each other and to public switched telephone networks (PSTNs).

One method that is used for mobile telephone transmission to a gateway is via a ground-based antenna that operates in UHF band. This is the same band used for broadcast television transmission. Use of this method limits the subscriber to communication within a cell which is the serving area to which the antenna can transmit using UHF band. Subscribers can move from cell to cell because hand-offs are possible from one cell to another. However, if no ground-based antenna is within a distance that can be reached using UHF band, such as in a rural area, a subscriber cannot use the mobile telephone.

Developments in mobile telephone system technology have led to mobile telephone systems that can transmit using a low earth orbit (LEO) satellite system, such as the Globalstar LEO satellite system. The mobile telephone systems that use LEO satellite systems can transmit to rural areas because the subscriber does not need to be within close range of a ground-based antenna. As a result, mobile telephone systems using LEO satellite systems are not limited to major cities as are mobile telephone systems that use antennas operating in the UHF band.

The transponder is the component in a satellite that receives and transmits signals from subscribers using mobile telephones. A satellite transponder must be able to carry a large number of subscribers simultaneously in order to be cost effective. Various satellite access schemes such as time division multiplex access (TDMA) and code division multiplex access (CDMA) allow simultaneous access to transponders by a large number of subscribers.

Digital CDMA is preferable to other satellite access schemes as more customers can be carried at a lower cost and higher quality. Low powered signals allow transmission of CDMA signals via small, inexpensive antennas requiring less expensive earth station and network equipment than other satellite access systems. However, because signal power is low, the power must be used efficiently. CDMA systems have low noise and interference because the gateways transmit using low powered signals.

In a CDMA system each customer is carried on an individual channel. CDMA systems modulate and interleave the individual channels so that a large number of channels are spread throughout the same waveform. As a result, multiple customers or users simultaneously share the same subbeam which is referred to interchangeably herein as a narrowband channel or a carrier. A subbeam or narrowband channel is typically approximately 1.23 MHZ in bandwidth.

Because multiple customers or users share the same subbeam, if one customer's or user's signal is transmitted at a higher power than the signals of the other customers or users on the channel, interference may occur which may result in unacceptable performance unless the number of users on the subbeam is reduced. In addition, lower power transmission helps overcome fading because signals can be spread through more of the subbeam and more capacity is available in the subbeam for diverse paths. Also, lower power transmission conserves power at the gateway. However, if the power of a customer's signal becomes too low, the quality of service for that customer becomes unacceptable.

For transmission via satellite, individual subbeams are modulated together to create one wideband channel. A wideband channel comprises 104 subbeams and has a bandwidth of 160 MHZ. However, the number of subbeams that may be carried by a wideband channel's ability is dependent on the power of each subbeam. The power available to transmit user traffic is the power that the satellite is capable of transmitting less the overhead power required for satellite operation. The number of users that may be transmitted essentially equals the power available to transmit user traffic divided by the power required for each individual user. Thus, the number of users that may be provided service is increased by maintaining overhead power levels and each individual user's channel at the minimum levels needed for optimum performance. This can be accomplished by limiting the power of each subbeam to the power necessary for high quality transmission. Control of the power of the subbeams and the wideband channel is needed to limit the power of each subbeam and wideband channel to the power needed for high quality transmission and to ensure efficient use of power which allows the maximum number of subbeams, and individual channels, to be carried on a wideband channel.

In addition, an accurate accounting of the power being consumed on the satellite is needed to manage the health of the satellite and reduce costs of satellite transmission. If power demands on a satellite exceed design expectations, satellite batteries will be relied on as energy sources more often than planned during satellite design. Additional demands on satellite batteries will require that the batteries be replaced more often at a cost to the satellite service provider. Satellite service providers often charge for the satellite power consumed. As a result, satellite service consumers need to track accurate measurements of their power demands on the satellite to maintain the power demands to the minimum level needed to provide quality service in order to reduce costs.

SUMMARY OF THE INVENTION

The present invention is a novel and improved method for the control of the gain of individual narrowband channels using a wideband power measurement. The system of the present invention is a transmit power tracking loop which controls the power by adjusting the gain applied to the transmitted signal.

Gain control by the transmit power tracking loop provides modifications in the gain applied by a variable gain amplifier based on feedback of power measurements before and after the signal is amplified by the variable gain amplifier. The power measurements include estimations of the power of each individual subbeam prior to amplification and an estimation of the power of the wideband channel after amplification. The power estimates of each individual subbeam are summed for the comparison with the power of the wideband channel.

Open loop gain control is also provided by controlling gain applied by the variable gain amplifier using open loop commands. Open loop commands are generated by an algorithm that calculates the proper gain that should be applied by the variable gain amplifier at regular intervals, such as one second. The algorithm for generating open loop commands calculates the gain that should be applied using the elevation of the antenna, the gain of the dish of the antenna, and various constants. Open loop commands are implemented by adjustments in gain applied by the variable gain amplifier and adjustments of gain applied by each subbeam's individual modulator.

In order to maintain an accurate accounting of the power used by the satellite, power levels at the gateway are stored and used to provide estimations of the power used by the satellite. The power estimates of each individual subbeam and of the wideband channel are sent to a ground operations control center to be stored for use by other processes to provide analysis, such as of the power consumed by the satellite. The gateway power measurements enable the satellite service consumer to obtain an accurate accounting of the power being consumed on the satellite. An accurate accounting of the power being consumed on the satellite enables the satellite service consumer to maintain the power demands at the minimum level needed to provide quality service and reduce costs. In addition, satellite service providers may use this information to manage the health of the satellite and reduce costs of satellite transmission.

Gain control balances the need to transmit at a low power to utilize capacity for as many customers as possible, avoid overdriving the satellite, and avoid violating flux density limits while maintaining sufficient power for each subbeam to provide high quality service to the users carried on the subbeam. Gain control also allows for adjustment to conditions at the gateway.

BRIEF DESCRIPTION OF THE DRAWINGS

The features, objects, and advantages of the present invention will become more apparent from the detailed description set forth below when taken in conjunction with the drawings in which like reference numbers indicate identical or functionally similar elements. Additionally, the left-most digit of a reference number identifies the drawing in which the reference number first appears.

DETAILED DESCRIPTION OF THE INVENTION

As mentioned previously, the present invention comprises a system and method for the control of the gain of individual subbeams or narrowband channels using a wideband power measurement. One embodiment of the present invention is in a mobile telephone system that uses LEO satellites for transmission and CDMA technology for satellite access.

Figure 1:
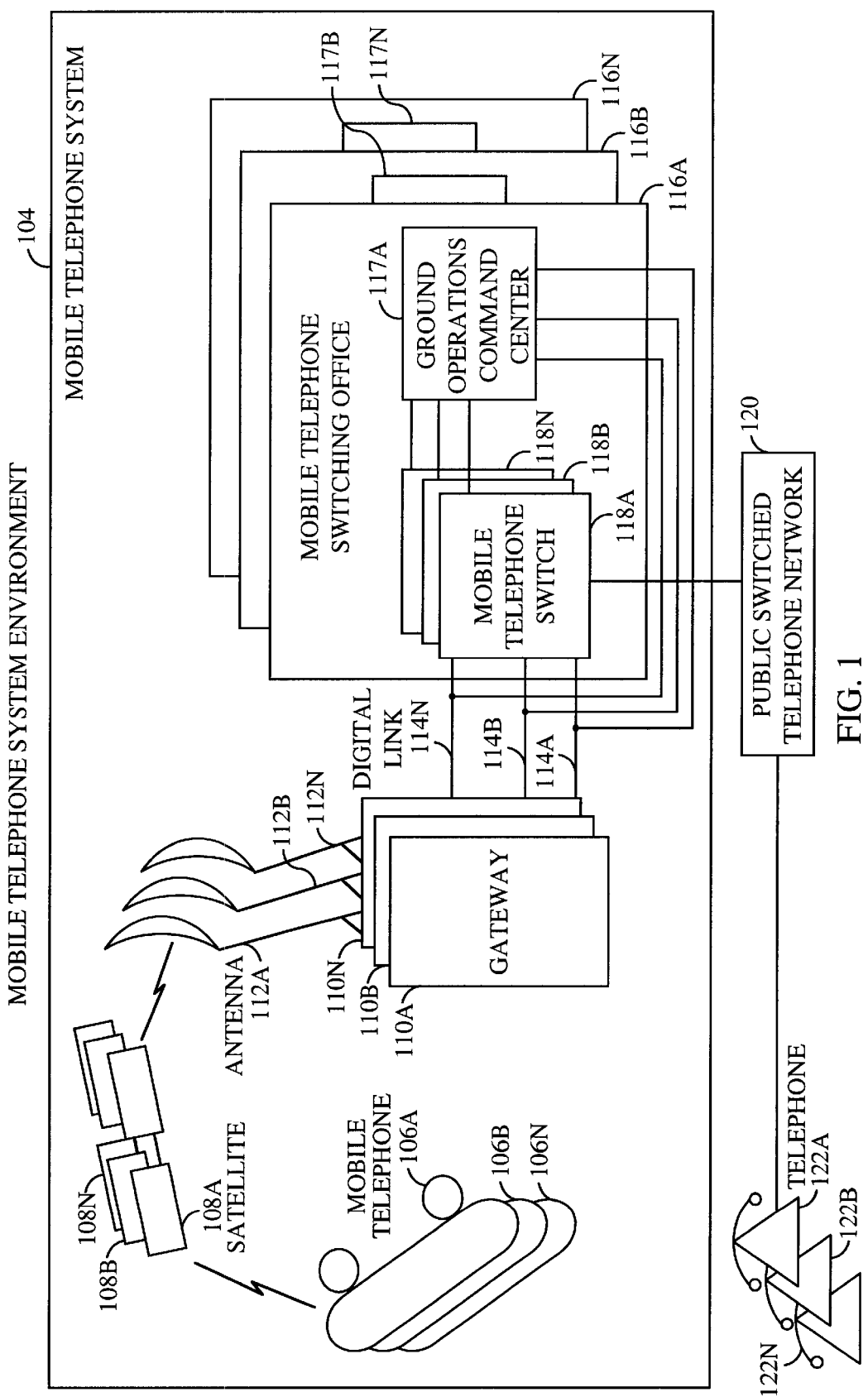
FIG. 1 is a block diagram of a mobile telephone system environment according to a preferred embodiment of the present invention.

A satellite based mobile telephone system can best be described by referencing the processing of a typical call. FIG. 1 is a block diagram of a satellite based mobile telephone system environment. A mobile telephone system 104 which communicates with other networks in the satellite based mobile telephone system environment comprises the components related to satellite based mobile telephone service. The components for a satellite based mobile telephone service are mobile telephones 106A, 106B, . . . 106n, low earth orbit satellites 108A, 108B, . . . 108n, antennas 112A, 112B, . . . 112n, gateways 110A, 110B . . . 110n, digital links 114A, 114B, . . . 114n, and mobile telephone switches 118A, 118B, . . . 118n and ground operation control centers 117A, 117B, . . . 117n located in mobile telephone switching offices 116A, 116B, . . . 116n. The total number of mobile telephone switches 118, gateways 110, satellites 108 and other equipment in a mobile telephone system 104 depend on desired system capacity and other factors well understood in the art.

An exemplary call can be described by referencing one of the plurality of each of the components illustrated in FIG. 1 that would be used to carry a particular call. A subscriber may place or receive a call using a mobile telephone 106. Other devices that may be used to place or receive a call include a data transceiver, a paging or position determination receiver, a wireless personal computer, and any other device that communicates via a wireless telecommunication network. A large number of subscribers may place or receive calls simultaneously. Each individual mobile telephone 106 is a wireless unit that includes a keypad, an earpiece, and a mouthpiece. Each mobile telephone 106 communicates directly with a satellite 108.

Satellites 108A, 108B, . . . , 108n together comprise a LEO satellite system. One such planned LEO satellite system includes 48 satellites traveling in low earth orbits approximately 763 miles from the earth's surface and inclined 50 degrees from the equator. The present invention could be used with other satellite communications, including satellite systems located at other distances and orbits, and with terrestrial-based wireless systems where power maintenance is a consideration.

Antenna 112 receives and transmits signals from and to mobile unit 106 via the satellite 108. Antenna 112 sends the signal received from the mobile unit to the gateway 110. If a mobile telephone is receiving a call or signal with information, antenna 112 receives the signal from gateway 110, as will be described in further detail with reference to FIG. 2, and transmits the signal to mobile unit 106 via satellite 108. Gateway 110 is connected to mobile telephone switch 118 located in mobile telephone switching office 116 via digital link 114, which is also referred to as a land line. Land lines are wired telecommunication links, such as copper or fiber optic cables.

The mobile telephone switch 118 is located in a mobile telephone switching office 116 which also houses other equipment needed to process mobile telephone calls. Mobile telephone switch 118 interconnects gateways 110 to each other and to public switched telephone network (PSTN) 120, as shown in FIG. 1.

Ground operation control centers 117 also within the mobile telephone switching centers 116 control the equipment within the mobile telephone system 104. Ground operation control center 117 controls mobile telephone 106, satellite 108, antenna 112, gateway 110, and mobile telephone switch 118 in the processing of the exemplary call. The ground control centers 117 are connected to the mobile telephone switch 118 that are located within the same mobile telephone switching center 116. In addition, the ground control centers 117 are connected to the digital links 114 in order to control equipment that is not located in the mobile telephone switch centers 116. The ground operation control centers 117 control the power of the signals transmitted by the equipment of the mobile telephone system 104 in order to confine the power to the levels needed for successful transmission and conserve power to maximize the number of calls that can be transmitted.

The PSTN 120 accepts and terminates calls to telephones 122A, 122B, ... 122n. The PSTN 120 can accept and terminate calls to any device that can communicate via a telecommunications network such as facsimile machines and personal computers.

Figure 2:
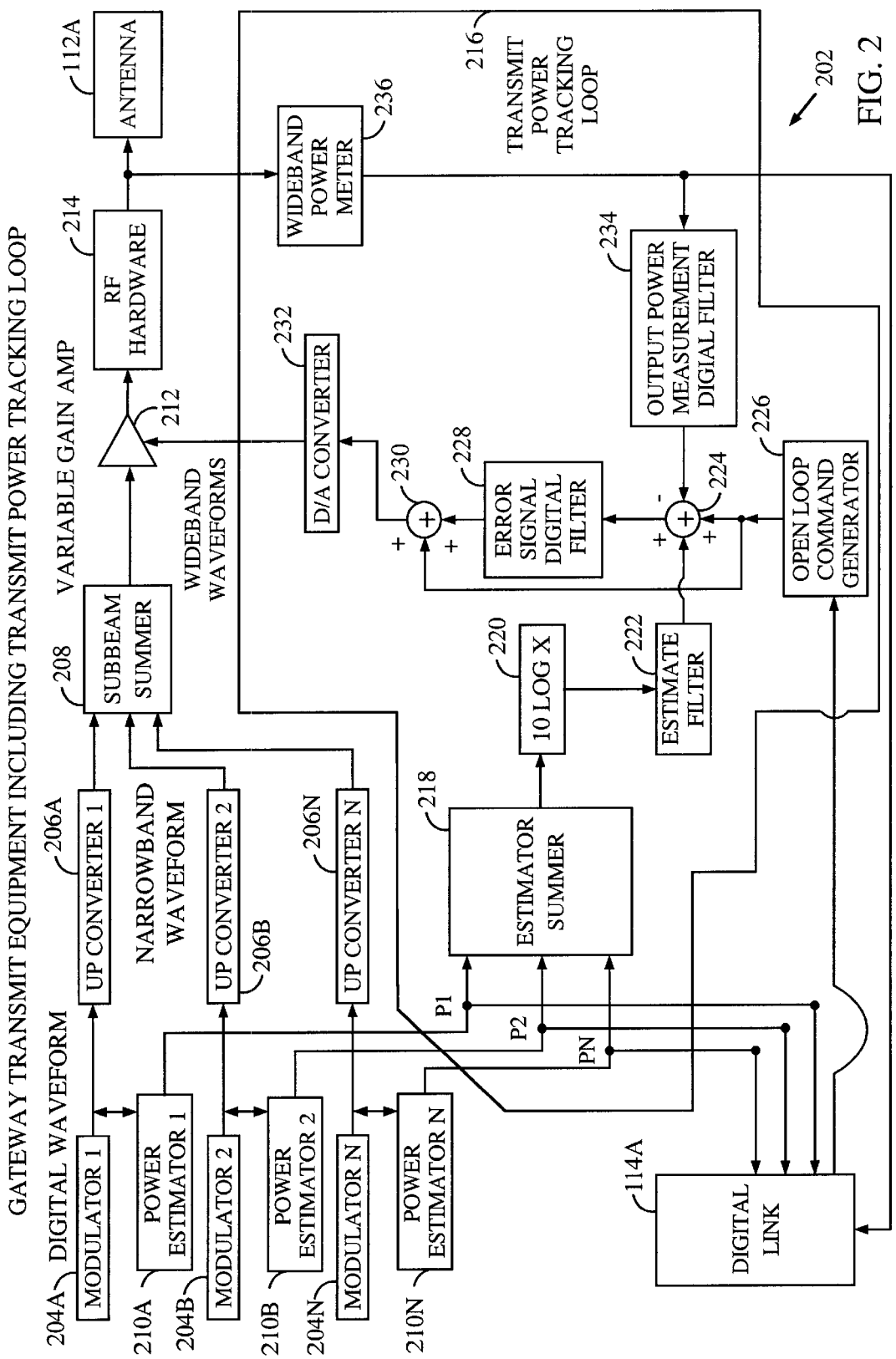
FIG. 2 is a block diagram of gateway transmit equipment including a transmit power tracking loop according to a preferred embodiment of the present invention.

FIG. 2 is a block diagram of gateway transmit equipment including a transmit power tracking loop 202 in gateway 110. The gateway 110 modulates and transmits signals from the mobile telephone switching office 116 to the mobile telephone 106 via the ground-based antenna 112 and satellite 108. One embodiment of the system and method of gain control of the present invention is implemented to control the gain of a signal being transmitted by the gateway transmit equipment 202. The gateway transmit equipment 202 modulates and transmits signals from the mobile telephone switching office 116 to the ground-based antenna 112. In addition to transmitting signals, the gateway 110 receives and demodulates signals from the ground-based antenna 112 to the mobile telephone switching office 116.

The gateway transmit equipment 202 comprises forward link equipment which transmits the signals to the mobile telephone 106 via the satellite 108. The transmit power tracking loop is implemented in the forward link system that transmits signals from the antenna 112 at the gateway 110 to the mobile telephone 106. The forward link refers to a segment of the system that sends forward signals from the gateway 110 to the mobile telephone 106. The reverse link refers to a segment of the system that accepts reverse signals from the mobile telephone 106 to the gateway 110. Power is controlled in the forward link system by adjusting the gain of a variable gain amplifier 212. This controls the power of the signal transmitted by the satellite transponder because the satellite transponder transmits a signal at the same power as the signal was received by the transponder.

The forward link equipment includes modulators 204A, 204B, ... 204n, upconverters 206A, 206B, ... 206n, a subbeam summer 208, power estimators 210A, 210B, ... 210n, an amplifier 212, analog hardware 214, and antenna 112. The modulators are interconnected to the mobile telephone switching office 116 via digital link 114. Each of the modulators 204 is connected to a corresponding one of the upconverters 206 for upconverting the modulated signal from infrared band frequency (IF) to radio band frequency (RF). The upconverters 206 are connected to an input of subbeam summer 208 which sums the signals. Each of the modulators is also connected to digital link 114 to receive open loop commands for gain adjustment applied by the modulators 204. The algorithm for determining gain adjustment applied by the modulators 204 will be discussed in further detail with respect to FIG. 4.

An output of subbeam summer 208 is connected to amplifier 212 which amplifies the signal. Amplifier 212 is connected to analog hardware 214 which performs additional conversions for satellite transmission. Analog hardware 214 is connected to the ground-based antenna 112 which transmits to satellite 108. Satellite 108 transmits the modulated signal to mobile unit 106. Power estimators 210 are connected to the outputs of each of the modulators 204 to obtain an estimation of the power of each individual subbeam prior to conversion by upconverters 206. Power estimators 210 are also connected to digital link 114 to provide the power estimates for each of the individual subbeams to the ground operations control center 117 for use by other processes.

The gateway transmit equipment 202 also comprises a transmit power tracking loop 216 which allows for gain adjustment using power measurements obtained before and after the signal is amplified by variable gain amplifier 212 and open loop commands. Transmit power tracking loop 216 controls the power of the transmitted signal by controlling the gain applied to the signal by variable gain amplifier 212 and modulators 204. Transmit power tracking loop 216 includes an estimator summer 218, a logarithm converter 220, an estimate filter 222, a first transmit power tracking loop summer 224, an open loop command generator 226, an error signal digital filter 228, a second transmit power tracking loop summer 230, a digital to analog (D/A) converter 232, an output power measurement digital filter 234, and a wideband power meter 236.

An overview of the interconnections of the components of the transmit power tracking loop 216 follows. Estimator summer 218 is connected to each of the estimators 210 to sum the estimations of power. Estimator summer 218 is also connected to logarithm converter 220 to perform conversion to decibel units. Logarithm converter 220 is connected to the estimate filter 222 for filtering. The estimate filter 222 is connected to the first transmit power tracking loop summer 224 as is the open loop command generator 226 and the output power measurement digital filter 234. The output power measurement digital filter 234 is connected to wideband power meter 236 for filtering the wideband power measurement prior to summing. The first transmit power tracking loop summer 224 is connected to the error signal digital filter 228 to provide the sum to variable gain amplifier 212. The error signal digital filter 228 is connected to second transmit power tracking loop summer 230 as is the open loop command generator 226 for summing. The second transmit power tracking loop summer 230 is connected to D/A converter 232 for digital to analog conversion prior to providing the error signal to the variable gain amplifier 212. Wideband power meter 236 is connected to digital link 114 to send wideband power measurements to ground operations control center 117. Open loop command generator 226 is connected to digital link 114 to obtain information from ground operations control center 117 for determining the open loop commands.

The functions of the components of the gateway transmit equipment will now be described. Mobile telephone switching office 116 sends the signal to modulator 204. Modulator 204 spread spectrum modulates the voice channel data and sends the modulated signal to upconverter 216. Modulator 204 is described in further detail in U.S. Pat. No. 5,103,459, entitled "System and Method for Generating Signal Waveforms in a CDMA Cellular Telephone System" incorporated by reference herein.

Modulator 204 sends the signal to upconverter 206. Upconverter 206 converts the frequency from intermediate band frequency (IF) to the higher radio frequency band (RF). LEO satellites 108 transmit signals at frequencies in the higher radio band frequency (RF) range. Signals produced by modulators 204 are in the intermediate frequency band (IF) range. The conversion performed by the upconverters 206 allows the radio frequency band (RF) signals from upconverters 206 to be sent to the antenna 112. Upconverters 206 are connected to subbeam summer 208. Subbeam summer 208 adds the signals to obtain a wideband signal. The wideband signal is sent from subbeam summer 208 to amplifier 212.

Amplifier 212 adjusts the gain based on gain adjustment using power measurements obtained before and after the signal is amplified by variable gain amplifier 212 and open loop commands. In addition, modulator 204 adjusts gain of individual subbeams. Determination of gain adjustments will be discussed in further detail with respect to FIGS. 3–5.

Amplifier 212 sends the signal to analog hardware 214 for additional conversions needed for satellite transmission. The resulting modulated signal is sent to antenna 112 for transmission to the mobile unit.

Transmit power tracking loop 216 receives input from two sources. One source is estimated subbeam power measurements determined by power estimators 210. In order to obtain the estimated power measurements from modulators 204, the output of each of the modulators 204 is connected to a corresponding one of the power estimators 210. Power estimators 210 provide an estimation of the power of each of the individual subbeams. Power estimators 210 are connected to estimator summer 218 which provides a sum of the estimated power output from modulators 204. Power estimators 210 are also connected to digital link 114 to provide the sum of the estimated power to ground operations control center 117.

The second source for transmit power tracking loop 216 is a power measurement of the signal output from analog hardware 214 obtained by wideband power meter 236. Wideband power meter 236 is connected to the output of analog hardware 214 to obtain the measurement of the power of the signal output from the analog hardware 214 that is transmitted by antenna 112. Various wideband power meters suitable for this purpose are available on the market. One such meter is an HP437B wideband power meter.

The power measurements obtained by estimators 210 are summed by estimator summer 218. As noted earlier, a wideband channel comprises 104 individual subbeams. Therefore, estimator summer 218 provides the total estimated power from 104 estimators 210.

Estimator summer 218 provides a summation of the outputs to a logarithm converter 220. The logarithm converter 220 determines the logarithm of the summation of the outputs and multiples the logarithm by 10. This converts the summation of the outputs to decibel units.

Logarithm converter 220 provides the summation of the output in decibel units to estimate filter 222. A filter reduces or eliminates power at specific frequencies. The estimate filter 222 is implemented in software, therefore, the design of the estimate filter 222 can be changed by changing the code of the software. However, the estimate filter 222 is not limited to a software implementation and may be implemented using any filter component. The estimate filter 222 is a composite of a filter used in estimating the power on an individual subbeam basis and a filter on the total estimated power of the individual subbeams. The gain of the estimate filter 222 is modeled in the transmit power tracking loop input-output model as the estimate filter gain 610 shown in FIG. 6. The estimate filter 222 provides the filtered summation of the output in decibel units to a first transmit power tracking loop summer 224.

Open loop command generator 226 also is connected to the first transmit power tracking loop summer 224. Open loop command generator 226 provides open loop commands 226 to variable gain amplifier 212 via the transmit power tracking loop 216. The open loop commands cause an adjustment in the gain applied to the signal by the modulator 204 and the variable gain amplifier 212. The process for generating open loop commands is described in more detail with respect to the transmit power tracking loop open loop procedures illustrated in FIGS. 4 and 5.

An output power measurement digital filter 234 is also connected to the first transmit power tracking loop summer 224. Similar to the estimate filter 222, the output power measurement digital filter 234 is implemented in software, therefore, the design of the output power measurement digital filter 234 can be changed by changing the code of the software. Also, similar to the estimate filter 222, the output power measurement digital filter 234 is not limited to a software implementation and may be implemented using any filter component. The output power measurement digital filter 234 is a composite filter that is applied to the signal that is output from the wideband power meter 236. The output power measurement digital filter 234 is a composite of both an analog and digital filter that reduce or eliminate power at specific frequencies from the signal output from the wideband power meter 236. The analog filter is internal to the wideband power meter 236. The gain of the analog filter is represented as output power measurement analog filter gain 622 in the transmit power tracking loop input-output model 602 illustrated in FIG. 6. The digital filter is the cascade of the digital filter in the wideband power meter 236 and the digital filter in gain control unit. The digital filter is represented as the output power measurement digital filter gain 626 in the transmit power tracking loop input-output model 602 illustrated in FIG. 6.

Wideband power meter 236 measures the power of the signal after amplification by amplifier 212. This is also after the individual subbeams have been summed into one wideband channel by subbeam summer 208. As a result, the power measured by wideband power meter 236 is the power of the wideband channel.

The response of wideband power meter 236 used to measure the transmitted power is fundamental to transmit power tracking loop 216. In one embodiment, wideband power meter 236 samples the power sensor voltage every 50 ms. In other words, the sampling rate is 20 Hz.

First transmit power tracking loop summer 224 receives the filtered summation of the estimated powers of each subbeam from the estimate filter 222, the open loop commands from open loop command generator 226, and the filtered wideband power measurement from the output power measurement digital filter 234. The first transmit power tracking loop summer 224 sums the output from the estimate filter 222, the output of the open loop command generator 226, and the negative of the output power measurement digital filter 234. In other words, the output from first transmit power tracking loop summer 224 is the sum of the output of the estimate filter 222 and the output of the open loop command generator 226 less the output from the output power measurement digital filter 234. The value of the output from the first transmit power tracking loop summer 224 is also referred to as the error signal because it provides error information for the adjustment in gain applied by the variable gain amplifier 212 to compensate for errors such as noise and other imperfections in the hardware of the system.

The output from the first transmit power tracking loop summer 224 is provided to the error signal digital filter 228. Similar to the estimate filter 222 and the output power measurement digital filter 234, the error signal digital filter 228 is implemented in software, therefore, the design of the error signal digital filter 228 can be changed by changing the code of the software. However, as with the other filters, the error signal digital filter 228 is not limited to a software implementation and may be implemented using any filter component. The error signal digital filter 228 reduces or eliminates power a specified frequencies from the output of the error signal.

Figure 6:
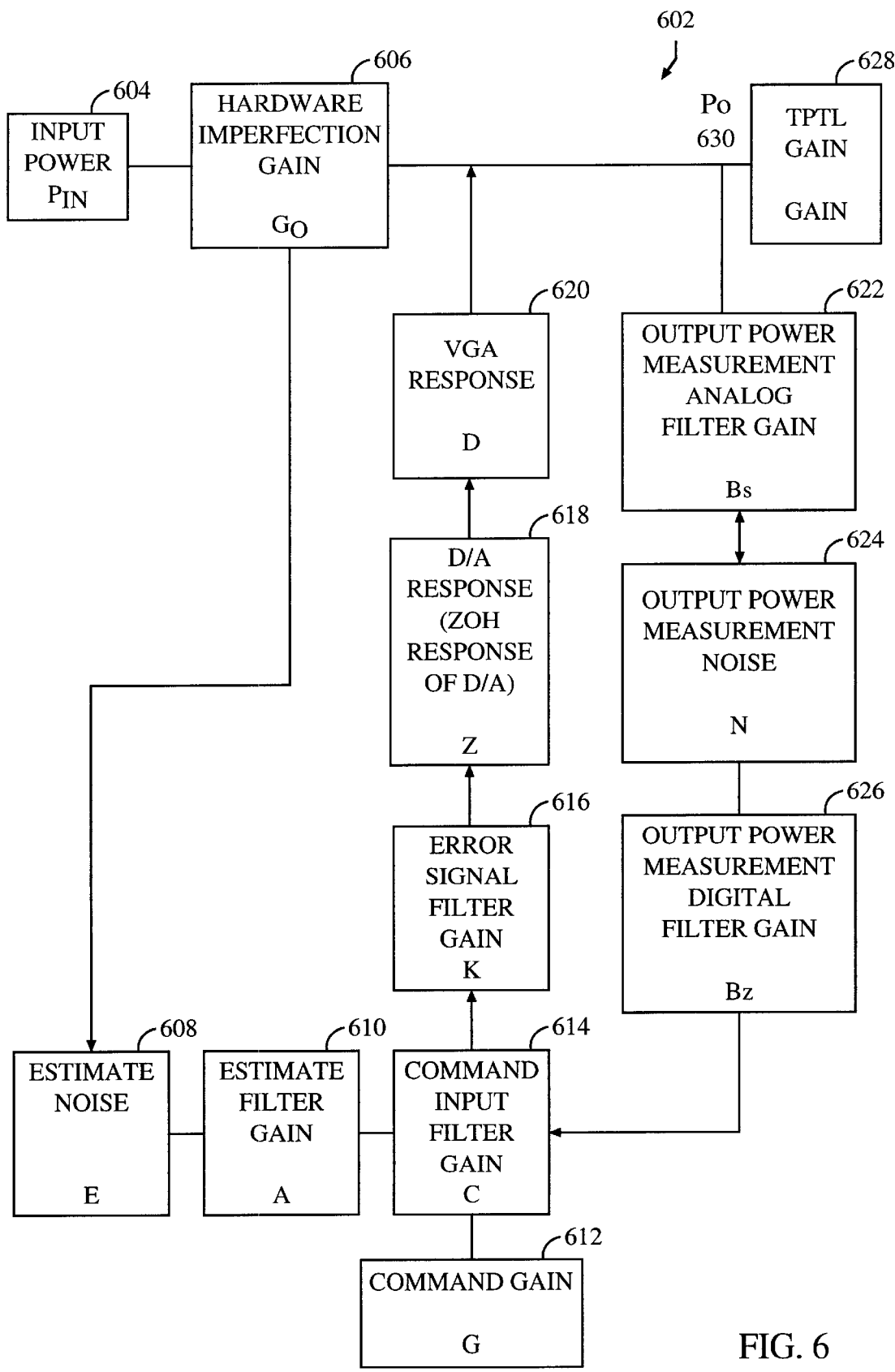
FIG. 6 is a block diagram of a transmit power tracking loop input-output model.

As discussed with respect to FIG. 6, the estimate filter 222 and the output power measurement digital filter 234 are designed to have the same gain resulting in zero difference output from the first transmit power tracking loop summer 224. Therefore, the error signal digital filter 228 which is applied directly to the error signal is the primary component responsible for the performance of the transmit power tracking loop 216.

The output of the error signal digital filter 228 is provided to the second transmit power tracking loop summer 230. The second transmit power tracking loop summer 230 also receives the open loop commands generated by the open loop command generator 226. The second transmit power tracking loop summer 230 sums the output from the error signal digital filter 228 and open loop command generator 226.

The output of the second transmit power tracking loop summer 230 is sent to D/A converter 232. D/A converter 232 converts the digital signal received from the second transmit power tracking loop summer 230 to an analog signal. D/A converter 232 performs the digital to analog conversion by taking many samples of the discrete instructions in a short period of time and creating an analog waveform. D/A converter 232 is connected to variable gain amplifier 212 to provide the analog error signal to the variable gain amplifier 212 to allow variable gain amplifier 212 to apply the correct gain to the signal sent to antenna 112.

Transmit power tracking loop 216 is calibrated before the power measurements of the signal sent to satellite 112 are obtained. Power estimators 210 provide power estimates of the individual narrowband channels received from each of the modulators 204 prior to amplification. Unfortunately, power estimators 210 add noise to the signal. In addition, the signals output from power estimators 210 are filtered. To ensure precision, the components of transmit power tracking loop 216 are selected based on a model that includes the effects of the noise and filter. The model will be discussed in further detail in FIG. 6.

The transmit power tracking loop 216 may be implemented using computer software which is stored on an application specific integrated circuit. However, the present invention may be stored on any one or more computer components that are capable of processing computer software. In addition, the present invention is limited to a software implementation and may be implemented on any electronic components that perform the functions described.

Figure 3:
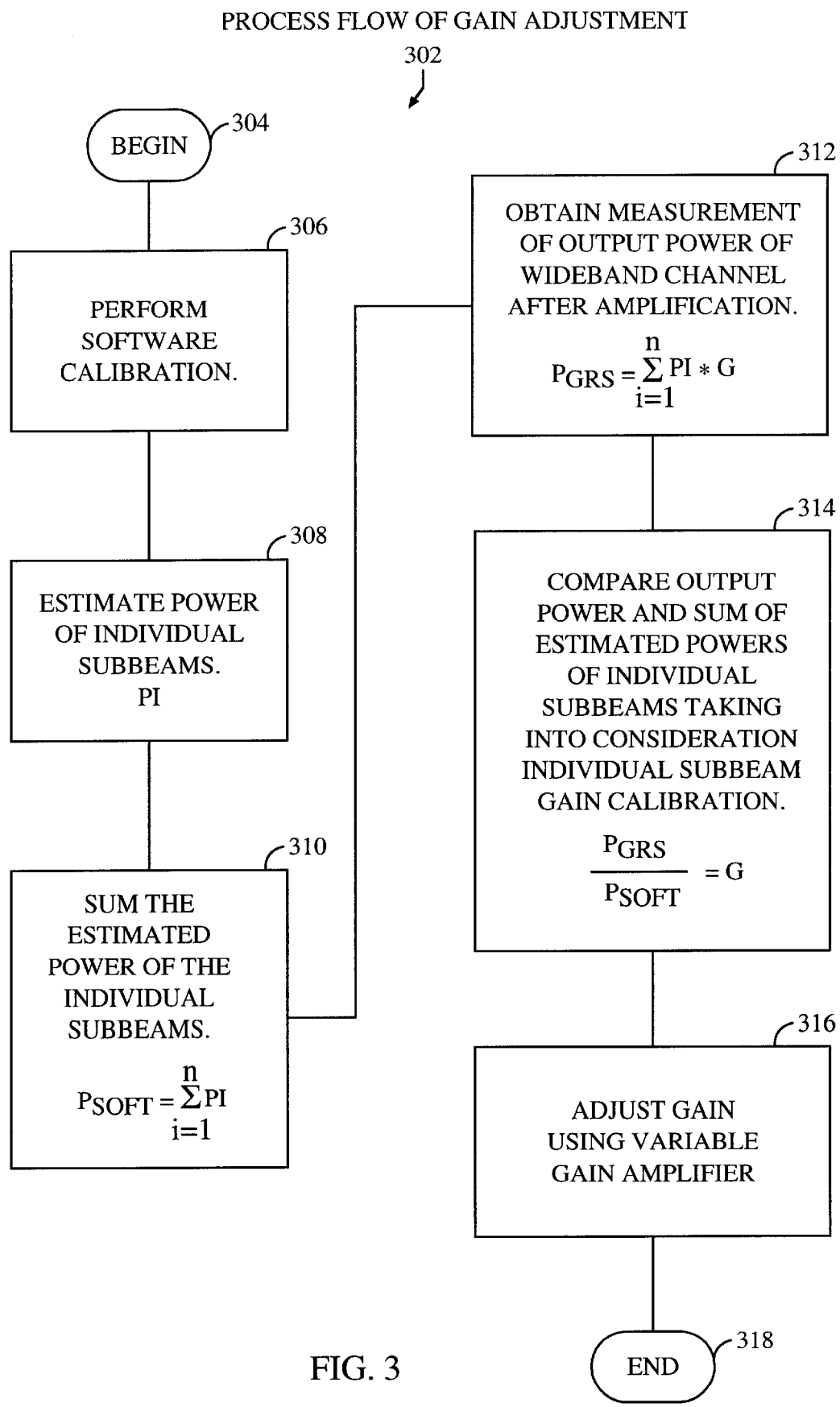
FIG. 3 is a flowchart illustrating the operation of gain adjustment of a transmit power tracking loop according to a preferred embodiment of the present invention.

FIG. 3 is a flowchart 302 which illustrates the operation of gain adjustment of transmit power tracking loop 216. The gain adjustment allows for modifications in the gain applied by variable gain amplifier 212 based feedback of power measurements before and after the signal is amplified by variable gain amplifier 212.

In step 306, transmit power tracking loop 216 performs a software calibration. The gain adjustment performed by transmit power tracking loop 216 is based on the gain calculated from the sum of the estimated powers of the narrowband channels and a measurement of the power of the wideband signal immediately prior to transmission via antenna 112.

In the simplest case, the gain of the individual narrowband channels is set to be equal. The gain, referred to as $G_i$ in the equations below, is the power of the individual narrowband channel that is output from amplifier 212 divided by the power of the individual narrowband channel that is output from modulator 204, which is referred to as $P_i$. Therefore, the power of the individual narrowband channel that is output from amplifier 212 divided by the power of the individual narrowband channel that is output from modulator 204 is the same for each individual narrowband channel.

Calibration is performed prior to the satellite coming into view. Calibration is performed by putting out a reference level of power output from each of the modulators 204. Therefore, $P_i$ is the same for each of the individual subbeams during calibration. Next the power of each individual narrowband channel output from amplifier 212 is measured. The ratio of the powers is set to a certain number which calibrates each individual narrowband channel.

In another embodiment, the gain, $G_i$, of each individual subbeam on a wideband channel does not need to be equal. Error correction software in modulators 204 can adjust the gain of individual channels to compensate for the effect of amplifier 212. The assumption used in determining adjustment to the gain is based on the power of each of the subbeams from the modulators 204 being equal. If the power of each of the individual subbeams is not equal, a subbeam's power can be adjusted by the corresponding modulator 204 that performs the modulation for the particular subbeam. Adjustment by the individual modulator 204 is also referred to as error correction. Error correction is based on the actual power measured out of the analog hardware 214 and the gain applied during the calibration procedure. Error correction can be implemented by commands from ground operations control centers 117 in the same way that modulators 204 accept open loop commands. Setting modulator gain with open loop commands will be discussed in further detail with respect to FIG. 4.

In step 308, the transmit power tracking loop 216 estimates the power of the individual narrowband channels. The power of an individual narrowband channel is represented in the following equations as $P_i$. As mentioned previously, the components of the transmit power tracking loop 216 that provide power estimates of the individual narrowband channels are the power estimators 210. Each narrowband channel has a corresponding estimator 210 that provides a power estimate for that particular narrowband channel.

In step 310, the estimated powers of the individual narrowband channels are added for a total estimated power of the wideband channel. The estimator summer 218 provides the summation of the outputs of the 104 power estimators 210 which is the sum of the estimated powers of the individual narrowband channels. The sum of the estimated powers of the narrowband channels is represented as $P_{SOFT}$ in Equation (1) below.

$$P_{SOFT} = \sum_{i=1}^{n} P_i \qquad (1)$$

In step 312, the transmit power tracking loop 216 obtains a measurement of the output power of the wideband channel after amplification. The output power of the wideband channel after amplification is measured by wideband power meter 236. This output power measurement is represented by $P_{GRS}$ in the equations below. If the system were free of errors, the output power measurement $P_{GRS}$ would be equal to the summation of the amplified estimated powers as represented in Equation (2) below.

$$P_{GRS} = \sum_{i=1}^{n} P_i * G_1 \qquad (2)$$

In step 314, the transmit power tracking loop 216 compares the output power obtained by wideband power meter 236 and the sum of the amplified estimated powers. Because a software calibration is performed in step 310, the gain for each of the individual subbeams can be treated as being equal. This is reflected in Equation (3) below.

$$P_{GRS} = G * \sum_{i=1}^{n} P_i \qquad (3)$$

As a result, the gain for the overall system can be determined by comparing the output power measured by wideband power meter 236 and the sum of the estimated powers provided by the estimation summer 218. Equation (4) below provides the calculation for overall system gain.

$$G = P_{GRS}/P_{SOFT} \qquad (4)$$

In step 316, the transmit power tracking loop adjusts the gain of the individual subbeams using variable gain amplifier 212.

Figure 4:
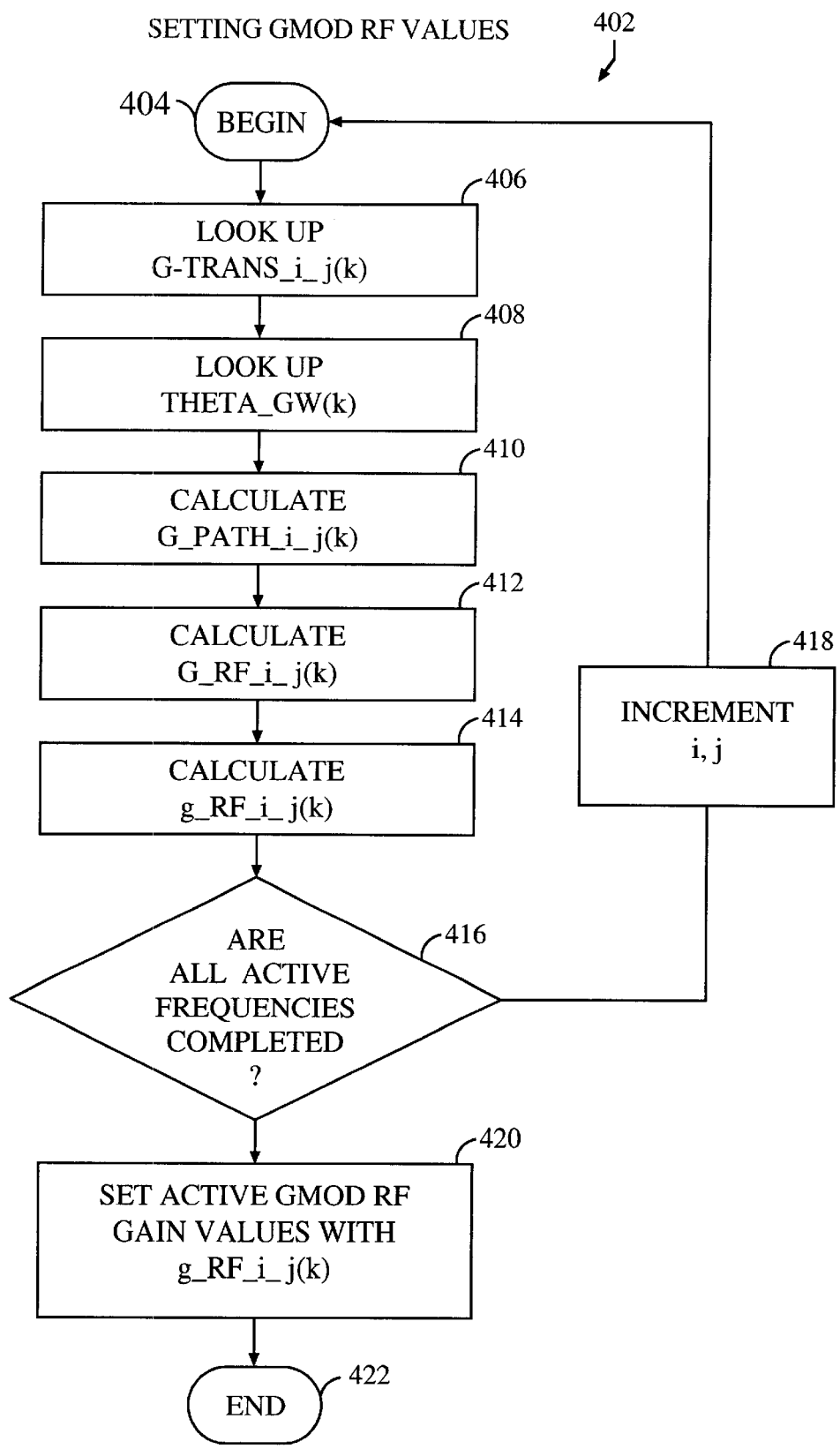
FIG. 4 is a flowchart illustrating the operation of the transmit power tracking loop open loop control for setting GMOD RF values according to a preferred embodiment of the present invention.

FIG. 4 is a flowchart 402 which illustrates the transmit power tracking loop open loop procedure for setting GMOD RF gain values. The transmit power tracking loop open loop procedure for setting GMOD RF gain values is the algorithm used to determine the open loop commands sent to the modulators 204 for adjustment of gain of each individual subbeam.

In one embodiment, the transmit power tracking loop open loop procedure is performed every second. The time interval in which the transmit power tracking loop open loop procedure is being performed is referred to as time interval k. The transmit power tracking loop open loop procedure is performed for each active subbeam within each active beam. The subbeam for which the transmit power tracking loop open loop procedure is being performed in time interval k is pointed to in software by pointer j and may be referred to as subbeam j. The beam that includes the subbeam j is pointed to in software by pointer i and may be referred to as beam i.

In step 406, the transponder gain for each beam i and subbeam j (G_TRANS_i_j(k)) is retrieved. The transponder gain adjustment for beam i and sunbeam j during transmit power tracking loop time step k is read from a table generated by a pre-contact gain calculation procedure. The pre-contact gain calculation procedure is performed prior to the transmit power tracking loop procedure to obtain values of the data needed by the transmit power tracking loop procedure.

In step 408, the antenna elevation (THETA_GW(k)) is retrieved. The transmit power tracking loop open loop procedure requires the elevation of antenna 112 to be calculated every time step, which is 1 second. The transmit power tracking loop open loop procedure retrieves the value of THETA_GW(k) from memory within ground operations control center 117 via digital link 114. The value of THETA_GW(k) was stored in memory of ground operations control center 117 as the result of processing of another software procedure. The value of the gateway antenna elevation is used to calculate the path gain (G_PATH(k)).

In step 410, the path gain for the subbeam (G_PATH_i_j(k)) is calculated. G_PATH_i_j(k) is obtained from a look-up table of G_PATH_i versus antenna 112 elevation. THETA_GW(k) is used to read from the table. Different tables are used for different polarizations. However, subbeams within a beam use a common table. The value of G_PATH_i_j(k) is calculated using linear approximation between points in the table. The values within the table are in decibels and increase with antenna 112 elevation. The increase is from 0E to 90E with a uniform step size of 0.5°.

In step 412, the modulator 204 (GMOD) to radio frequency (RF) hardware 236 gain (GMOD RF gain) is calculated. The GMOD RF gain value is calculated from Equation 5 below.

$$G\_RF\_i\_j(k) = -(G\_PATH\_i\_j(k) + G\_TRANS\_i\_j(k)) \qquad (5)$$

In step 414, the modulator 204 (GMOD) to radio frequency (RF) hardware 236 gain (GMOD RF gain) for each individual subbeam is calculated from Equation 6 below.

$$g\_RF\_i\_j(k) = \mathrm{round}\left(g\_RF\_o \cdot \left(10 \frac{G\_RF\_i\_j(k)}{20}\right)\right) \qquad (6)$$

In Equation 6 above, g_RF_o is the nominal GMOD RF gain value which in the preferred embodiment is 46. The value of g_RF_i_j(k) is the GMOD RF gain for beam i and subbeam j in linear units. The parentheses indicate that the value should be rounded to the nearest integer. The value of g_RF_i_j(k) is restricted to the range 33 to 63. Values calculated outside of this range should be truncated. The value of g_RF_i_j(k) is calculated for each active subbeam during time step k.

In step 416, a determination is made as to whether all frequencies with active subbeams have been analyzed using the transmit power tracking loop open loop procedure. If in step 416 it is determined that all frequencies with active subbeams have not been analyzed using the transmit power tracking loop open loop procedure, then the transmit power tracking loop procedure proceeds to step 418. If in step 416 it is determined that all frequencies with active subbeams have been analyzed using the transmit power tracking loop open loop procedure, then the transmit power tracking loop procedure proceeds to step 420.

In step 418, the transmit power tracking loop open loop procedure increments the subbeam pointer j to point to the next subbeam. If all of the subbeams in a beam have been analyzed, the transmit power tracking loop open loop procedure increments the beam pointer i to point to the next beam and the subbeam pointer j to point to the first subbeam within the next beam.

In step 420, the transmit power tracking loop open loop procedure sets the active GMOD RF gain values with g_RF_i_j(k). The GMOD RF gain value for a particular modulator 204 is updated only if the value of g_RF_i_j(k) is different from g_RF_i_j(k!1).

Figure 5:
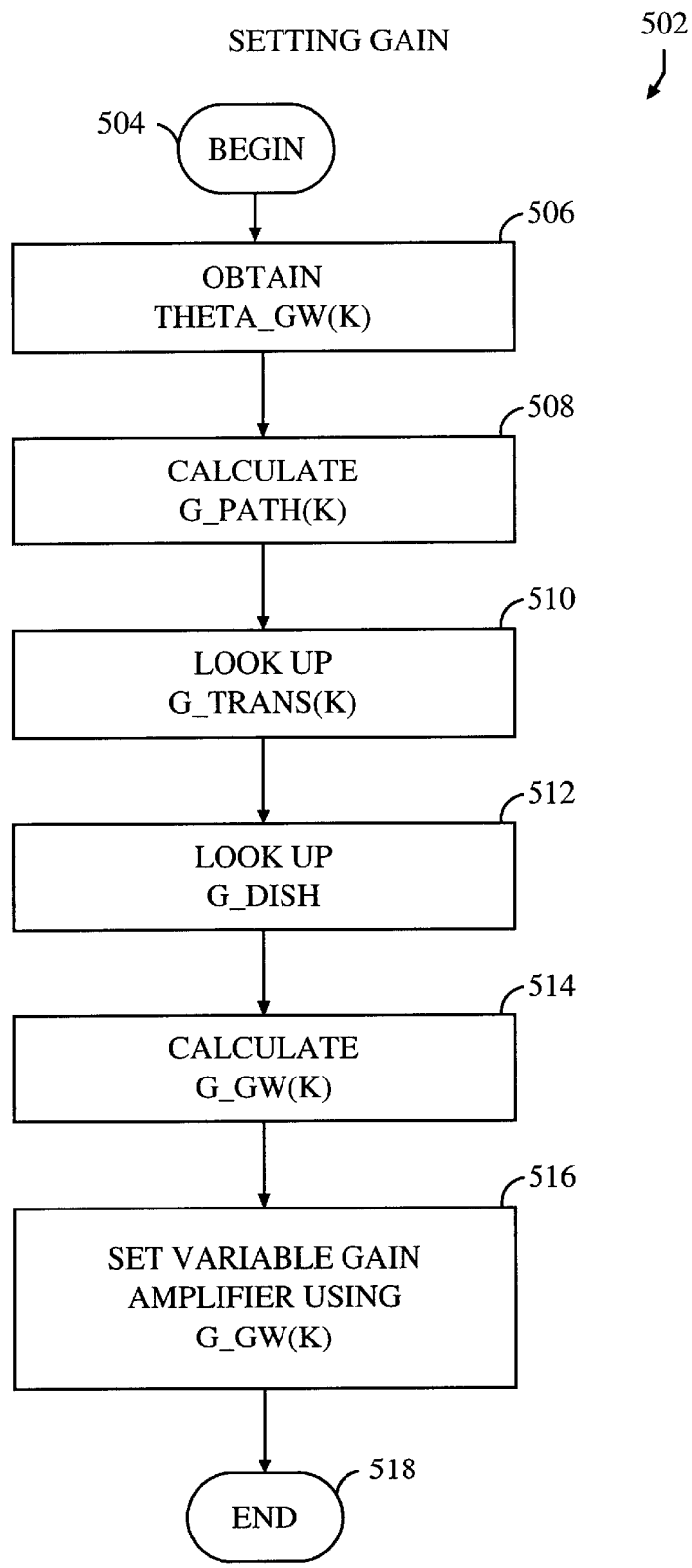
FIG. 5 is a flowchart illustrating the operation of the transmit power tracking loop open loop control for setting variable gain amplifier gain according to a preferred embodiment of the present invention.

FIG. 5 is a flowchart 502 which illustrates the operation of the transmit power tracking loop open loop procedure for setting the variable gain amplifier 212. The transmit power tracking loop open loop procedure for setting the variable gain amplifier 212 is the algorithm used for determining open loop commands to be sent to the variable gain amplifier 212 for gain adjustment of the wideband channel.

In step 506, the antenna gain (THETA_GW(k)) is obtained. The transmit power tracking loop open loop procedure retrieves the value of THETA_GW(k) from memory within ground operations control center 117 via digital link 114. The value of THETA_GW(k) was stored in memory of the ground operations control center 117 as the result of processing of another software procedure.

In step 508, the path gain common to all beams and subbeams (G_PATH(k)) is calculated. G_PATH(k) is calculated using linear interpolation between points in a table of G_PATH versus antenna 112 elevation THETA_GW(k). Because the antenna 112 is a C-band antenna pattern which is rotationally symmetric, the path gain is only a function of the antenna 112 elevation. The table used to calculate G_PATH(k) is based on a curve that is plotted using assumptions that minimize the peak-peak deviation of the curve at various C-band frequencies. Therefore, the curve does not correspond to the path gain at the mid-band or any other frequency. This is done to conserve GMOD RF gain adjustment range.

Table 1 shows the structure of the G_PATH versus THETA_GW table. Note, the gateway antenna elevation is monotonically increasing from 0° to 90° with a uniform step size of 0.5°.

TABLE 1

G_PATH versus THETA_GW Table Structure

| Index | THETA_GW (Degrees) | G_PATH (dB) |
|---|---|---|
| 0 | 0 | −176.430 |
| 1 | 0.5 | −176.291 |
| 2 | 1.0 | −176.152 |
| ... | ... | ... |
| 179 | 89.5 | −168.016 |
| 180 | 90 | −168.02 |

In step 510, the transponder gain (G_TRANS(k)) is retrieved. A pre-contact gain calculation procedure stores the value of the common transponder gain in 1 second intervals. Every transmit power tracking loop time step, the value of k is used to retrieve a value for G_TRANS(k) stored during the pre-contact gain calculation procedure.

In step 512, the antenna dish gain (G_DISH) is retrieved. During the pre-contact gain calculation procedure, a value of G_DISH is also determined. The value of G_DISH is valid for all time steps during the pass.

G_DISH is defined as the arithmetic mean of the minimum antenna 112 gain and the maximum antenna 112 gain taken from the ensemble formed by the antenna gains of all of the possible subbeam frequencies in a polarization. The antenna gain includes the gain of the feed network starting from the power meter test coupler. A table of G_DISH versus polarization stores the values of G_DISH. One value is stored for each polarization for a total of eight values. The information stored in the table is shown in Table 2.

TABLE 2

Center Gateway Antenna Gain Versus Polarization

| Antenna | Polarization | G_DISH |
|---|---|---|
| 0 | LHCP | 48 dB (to be provided by antenna vendor) |
| 0 | RHCP | 48 dB (to be provided by antenna vendor) |
| 1 | LHCP | 48 dB (to be provided by antenna vendor) |
| 1 | RHCP | 48 dB (to be provided by antenna vendor) |
| 2 | LHCP | 48 dB (to be provided by antenna vendor) |
| 2 | RHCP | 48 dB (to be provided by antenna vendor) |
| 3 | LHCP | 48 dB (to be provided by antenna vendor) |
| 3 | RHCP | 48 dB (to be provided by antenna vendor) |

In step 514, the gateway common gain (G_GW(k)) is calculated. The Gateway gain common to all beams and subbeams for time step k is calculated from Equations (7)–(10) below.

$$G\_GW(k) = G - (G\_RF\_o + G\_FIXED + G\_DISH + G\_PATH(k) + G\_TRANS(k)) \quad (7)$$

$$G = 54.2323 \frac{dBW}{dBLSB^2} \quad (8)$$

$$G\_RF\_o \times 20 \log(46) = 33.25 \; dBLSB^2 \quad (9)$$

$$G\_FIXED = -60.096 \; dB \quad (10)$$

In step 516, the variable gain amplifier gain is set using G_GW(k).

FIG. 6 illustrates a transmit power tracking loop input and output model 602. The inputs and output are defined in Table 3 below. FIGS. 2 and 3 will be referenced to assist in the description. The transmit power tracking loop input and output model uses wideband measurements. In addition, the modeling is done based on the assumption that the calibration procedure has been instituted.

TABLE 3

Transmit Power Tracking Loop Inputs and Output

| | |
|---|---|
| A | Estimate filter gain 610 |
| B | Output Power Measurement Composite Filter Gain (not shown in FIG. 6) |
| $B_s$ | Output Power Measurement Analog Filter Gain 622 |
| $B_z$ | Output power measurement digital filter gain 626 |
| C | Command input filter gain 614 |
| D | VGA response 620 |
| E | Estimate Noise 608 |
| G | Command Gain 612 |
| $G_o$ | Hardware imperfection gain 606 |
| GAIN | Transmit Power Tracking Loop Gain 628 |
| K | Error signal filter gain 616 |
| N | Output Power Measurement Noise 624 |
| $P_{in}$ | Transmit Power Tracking Loop Input Power 604 |
| $P_o$ | Output Power 630 |
| Z | D/A Response 618 |

The input in the transmit power tracking loop input and output model 602 is the transmit power tracking loop input power 604 referred to in the equations below and Table 1 above as $P_{in}$. The transmit power tracking loop input power ($P_{in}$) 604 is the power of the sum of the signals that are received from the modulators 204 referred to as $P_{SOFT}$ above. $P_{SOFT}$ is determined by the estimator summer 218 by summing the estimated powers of the individual narrowband channels that is obtained from the power estimators 210.

The signal into the transmit power tracking loop 216 has a nominal gain referred to as the hardware imperfection gain 606 referred to in the equations below and in Table 1 above as $G_o$. The hardware imperfection gain 606 represents a nominal gain selected for modeling purposes to represent the gain associated with the transmit power tracking loop hardware 216.

Another gain associated with the transmit power tracking loop 216 is the command gain 612 referred to in Table 1 above and the equations below as G. As discussed, the transmit power tracking loop 210 accepts gain adjustments via open loop commands. The command gain 612 is the amplification of the signal due to open loop commands.

Inaccuracies in the hardware of the transmit power tracking loop cause an elevation in the power of the transmitted signals. The first of these inaccuracies is the estimate noise 608 which is the noise due to the estimate of the input power referred to in the equations below and in Table 1 above as E. The power estimators 210 estimate the input power into the transmit power tracking loop 216 as discussed in step 306 of FIG. 3. The circuitry that a signal passes through, such as circuitry in a power estimator 210, has imperfections that provide a small amount of power to the system which is also referred to as noise. The noise caused by circuitry in the estimators 210 is the estimate noise 608.

The second inaccuracy is the noise due to the measurement of output power 624 referred to in Table 1 above and the equations below as N. Similar to other components of the transmit power tracking loop 210, the circuitry of the power meter 236 causes a slight amplification of the signal which is also referred to as noise. The noise due to the power meter 236 is referred to as the noise due to the measurement of output power 624.

The power inputs to the transmit power tracking loop 210 are filtered by four filters implemented in software. A filter reduces or eliminates power at specified frequencies. Because the filters are implemented in software, the design of the filters can be changed by changing the code of the software. Because of imperfections in the circuitry of these filters, each of these filters causes a gain in the system.

The first of these filter gains is the estimate filter gain 610 referred to in Table 1 and the equations below as A. The software estimate of input power filter gain 610 is a composite of a gain of a filter used in estimating the power on an individual beam basis and a gain of a filter on the total estimated power of the individual subbeams.

The second filter gain is the command input filter gain 614 referred to in Table 1 and the equations below as C. The command input filter gain 614 is a filter applied to the open loop commands output from the open loop command generator 226.

The third filter gain is the error signal filter gain 616, referred to in Table 1 and the equations below as K. The error signal filter gain 616 digitally filters the error signal that is provided to the variable gain amplifier 212. As discussed with respect to step 316 of FIG. 3, transmit power tracking loop 216 adjusts the gain of the wideband signal using amplifier 212. The gain is adjusted via an error signal produced by variable gain amplifier 212. The error signal filter gain 616 is the primary component responsible for the performance of the transmit power tracking loop 216.

The fourth filter is the output power measurement composite filter gain which is the composite of the analog and digital filter gains applied to the measurement of output power. The output power measurement composite filter gain is referred to in Table 1 above and the equations below as B (and is not shown in FIG. 6). The output power measurement composite filter is the composite of both an analog and digital filter that are applied to the signal output from power meter 236. The gain of the analog filter is represented as an output power measurement analog filter gain 622, referred to in Table 1 and the equations below as $B_s$. The gain of the digital filter is represented as a output power measurement digital filter gain 626, referred to in Table 1 and the equations below as $B_z$. The overall filtering affect of the filters applied to the signal output from the power meter 236 is given as the output power measurement composite filter B in Equation (11) below.

$$B=B_s*B_z \qquad (11)$$

The VGA response 620, referred to as D in Table 1 above and the equations below, is the response of variable gain amplifier (VGA) 212 to changes in the control voltage. Equipment performance varies based on the voltage used to operate the equipment. The VGA response 620 is a measurement of the response of variable gain amplifier 212 to the changes in voltage that provide power to variable gain amplifier 212. The variable gain amplifier 212 is assumed to have a linear gain slope in dB/V so the value is constant.

An additional input is the D/A response 618, referred to in Table 1 above and the equations below as Z. The D/A response 618 is the model of the response of the D/A converter 232 to discrete instructions. D/A converter 232 takes many samples of the discrete instructions in a short period of time and creates an analog waveform. In order to include the response of the D/A converter 232 in the model, it is modeled as a zero order hold response because each one of the actual samples taken cannot be shown.

The output power 630, is the power that is output resulting from the inputs described. The output power 630 is the power of the signal transmitted by antenna 112.

The transmit power tracking loop gain 628, referred to as GAIN in Table 1 and the equations below, is the overall gain of the system which is the power of the signal transmitted by antenna 112 divided by the power into upconverters 216.

The design of transmit power tracking loop 216 is analyzed using the transmit power tracking loop input and output model 602. The transmit power tracking loop 216 is a multi-input, single output system. The single output is the output power 630 which is the transmit power tracking loop input power 604 amplified by the transmit power tracking loop gain 628. The transmit power tracking loop gain 628 can be calculated from the various inputs as described below.

The transmit power tracking loop gain 628 is a sum of five responses to the inputs into the system. The first of these responses, the input response, describes the response of the gateway to the transmitted waveform power. The optimal design is for a small input response which is accomplished by choosing filters such that the filtering effect of the estimate filter gain 610 and the overall effect of the gain of the analog and digital power meter filters 622 and 624 are as close as possible. Equation (12) represents the value of the input response. The variables in Equation (12) were provided in Table 1 and are described in more detail with respect to FIG. 6.

$$\text{Input Response} = \frac{(A-B)ZDK}{1+ZDBK}*P_{in} \qquad (12)$$

For the preferred embodiment of the present invention, the following values for the estimate filter gain 610, the output power measurement analog filter gain 622, and the output power measurement digital filter gain 626 were selected. These values are software configurable and can be modified with software changes. The values are continuous which is shown by defining them as functions of s.

$A(s)=6.28/(s+6.28)$ $B_s(s)$=fast analog filter in HP437B $B_z(s)=6.28/(s+6.28)$ The values associated with the digital filters can be converted into discrete values by substituting s=(z−1)/T, where T is a 50 millisecond time period. The discrete values for the preferred embodiment of the present invention are below.

$B_z(z)=0.314/(z-0.686)$ $A(z)=0.314/(z-0.686)$

The second response, the disturbance response, describes the response of the gateway to changes in the gain of the analog hardware. The disturbance response must reject the gain fluctuation spectrum of the gateway hardware. Consequently, the disturbance response should be high-pass and result in zero steady-state error. The disturbance response governs the time the transmit power tracking loop 216 requires to correct for gain error caused by amplifiers entering compression. Equation (13) defines the disturbance response. The variables in Equation (13) are provided in Table 1 and are described in more detail with respect to FIG. 6.

$$\text{Disturbance Response} = \frac{1}{1+ZDBK} * G_o \tag{13}$$

The third response is the noise response. The noise response describes the response of the gateway gain to the noise measurement of the gateway output power. The noise response is roughly reciprocal of the disturbance response. That is to say, the noise response is low-pass if the disturbance response is high-pass. Improved disturbance response comes at the expense of increased noise response. Equation (14) defines the noise response. The variables in Equation (14) are provided in Table 1 and are described in more detail with respect to FIG. 6.

$$\text{Noise Response} = \frac{B_Z KZD}{1+ZDBK} * N \tag{14}$$

The fourth response is the estimate response which describes the response of the gateway gain to noise in the measurement of the gateway input power. Again, the noise response is roughly the reciprocal of the disturbance response. Therefore, the noise response is low-pass if the disturbance response is high-pass and improved disturbance response performance comes at the expense of estimate response. Equation (15) defines the estimate response. The variables in Equation (15) are provided in Table 1 and are described in more detail with respect to FIG. 6.

$$\text{Estimate Response} = \frac{AKZD}{1+ZDBK} * E \tag{15}$$

The fifth response is the command response. The command response describes the response of the gateway to open loop commands. The dynamics of the command response will govern the open loop control. As a result, the command response should be designed to be as quick as possible with little overshoot and zero steady state error. In the preferred embodiment of the present invention, the open-loop commands create an overshoot in the gain of approximately 35% which reduces to zero after approximately one second. Equation (16) defines the command response. The variables in Equation (16) are provided in Table 1 and are described in more detail with respect to FIG. 6.

$$\text{Command Response} = \frac{(1+CK)ZD}{1+ZDBK} * G \tag{16}$$

The transmit power tracking loop gain (GAIN) 628 is the sum of the five responses shown in Equations (12)–(16). Equation (17) for the transmit power tracking loop gain (GAIN) is provided below. The variables in Equation (17) are provided in Table 1 and are described in more detail with respect to FIG. 6.

$$\text{GAIN} = \frac{(1+K)ZD}{1+ZDBK}*G + \frac{1}{1+ZDBK}*G_o + \frac{(A-B)ZDK}{1+ZDBK}* \tag{17}$$
$$Pin + \frac{AKZD}{1+ZDBK}*E - \frac{B_ZKZD}{1+ZDBK}*N$$

The error signal filter gain 616 is primarily responsible for the transmit power tracking loop 216 performance. In the preferred embodiment of the present invention, the error signal filter gain 616 was selected to give zero steady state error and have a gain that provided a fast disturbance response. The digital filter applied to the error signal 616 is defined as a continuous function of k in Equation (18).

$K(s)=k/s$ (18)

In one embodiment, the continuous value, k, was selected to be equal to 2.38 (k=2.38).

As with the digital filters applied to the components of the transmit power tracking loop 216 that provide power measurements, the value of the error signal filter gain 616 can be converted into a discrete value by substituting s=(z−1)/T, where T is a 50 millisecond period of time. The discrete value for the digital filter applied to the error signal 616 is K(z)=0.119/(z−1).

The discrete time filters are realized in the transmit power tracking loop 216 software as the following equations.

$y(n)$=linearized $(d(n))$ $d(n)=k(n)+g(n)$ $k(n)=k(n-1)+0.199a(n-1)+0.119g(n-1)-0.119b(n-1)$ $b(n)=0.686b(n-1)+0.314p(n-1)$ The variables of the equations above are defined as follows.

y(n)=the linearized sample output to the VGA D/A during time n, the linearizer is realized as a lookup table d(n)=intermediate value during time n k(n)=intermediate value during time n b(n)=intermediate value during time n a(n)=the software estimate of total input power during time n p(n)=the power measurement of total output power from the power meter 236 during time n g(n)=the open-loop command during time n An additional design consideration is synchronization in measurement time of power estimators 210 and power meter 236. In the preferred embodiment, synchronization is acceptable if it is no worse than 50 ms.

Other embodiments of the present invention are possible. The present invention is not limited to use in modulation systems for mobile telephone systems. Any modulation system that benefits from control of power could include the transmit power tracking loop 216 of the present invention. In addition, the present invention could be used when the signal is received as well as when the signal is transmitted.

In addition, measurement devices and measurements taken may be varied in the present invention. The present invention may include additional estimator summers 218 and/or may combine estimators 210 and estimator summers 218 in one unit. Similarly, multiple power meters 236 may be included in the present invention. Also, the present invention is not limited in the use of a particular power meter 236, such as the HP437B. Any meter providing the functionality described may be used. Furthermore, additional power measurements may be taken by meters such as power meter 236 or estimators such as estimator 210.

Other embodiments of the method of the present invention are possible. The present invention could be used to control the power of some of the narrowband channels but not all. In addition, as mentioned, the present invention can be implemented with or without the narrowband channels having equal gains. If the gains of the narrowband channels are not equal, software correction can be used to compensate for the inequalities.

Other designs are possible in addition to the preferred design described with respect to the transmit power tracking loop input-output model 602. The filters described in the preferred embodiment of the present invention are not required, such as the estimate filter 222, the output power measurement digital filter 234, and the error signal digital filter 228. If one or more of these filters are implemented, different values are possible other than those described. Also, additional filters and amplifiers may be included in the system to improve the accuracy of the power.

While various embodiments of the present invention have been described above, it should be understood that they have been presented by way of example only, not limitation. Thus, the breadth and scope of the present invention should not be limited by any of the above-described exemplary embodiments, but should be defined only in accordance with the following claims and their equivalents.

What is claimed is:

1. A method of controlling gain of a modulator, comprising:
   obtaining a transponder gain;
   obtaining an antenna elevation;
   calculating path gain using said antenna elevation;
   calculating a modulator gain using said path gain and said transponder gain; and
   adjusting the gain of the modulator.

2. A system for controlling gain of a modulator, comprising:
   first obtaining means for obtaining a transponder gain;
   second obtaining means for obtaining an antenna elevation;
   first calculating means for calculating path gain using said antenna elevation;
   second calculating means for calculating a modulator gain using said path gain and said transponder gain; and
   adjusting means for adjusting the gain of the modulator.

3. A method of controlling gain input into an antenna, comprising:
   obtaining an antenna elevation;
   calculating path gain using said antenna elevation;
   obtaining a transponder gain;
   obtaining an antenna dish gain;
   calculating a common gateway gain using said path gain, said transponder gain, and said antenna dish gain;
   adjusting the gain of a variable gain amplifier.

4. A system of controlling gain input into an antenna, comprising:
   first obtaining means for obtaining an antenna elevation;
   first calculating means for calculating path gain using said antenna elevation;
   second obtaining means for obtaining a transponder gain;
   third obtaining means for obtaining an antenna dish gain;
   second calculating means for calculating a common gateway gain using said path gain, said transponder gain, and said antenna dish gain;
   adjusting means for adjusting the gain of a variable gain amplifier.

\* \* \* \* \*